(12) United States Patent
Cai et al.

(10) Patent No.: US 6,830,966 B2
(45) Date of Patent: Dec. 14, 2004

(54) FULLY SILICIDED NMOS DEVICE FOR ELECTROSTATIC DISCHARGE PROTECTION

(75) Inventors: Jun Cai, Portland, ME (US); Keng Foo Lo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/170,248

(22) Filed: Jun. 12, 2002

(65) Prior Publication Data

US 2003/0230780 A1 Dec. 18, 2003

(51) Int. Cl.[7] .................. H01L 21/336; H01L 21/8234
(52) U.S. Cl. ........................................ 438/197; 257/355
(58) Field of Search ................................. 257/355, 356, 257/357, 358, 359, 360, 361, 362, 363, 364, 365; 438/197

(56) References Cited

U.S. PATENT DOCUMENTS

| | | |
|---|---|---|
| 5,369,041 A | 11/1994 | Duvvury ........................ 437/6 |
| 5,728,612 A | 3/1998 | Wei et al. .................... 438/200 |
| 5,843,813 A | 12/1998 | Wei et al. .................... 438/200 |
| 6,100,125 A | 8/2000 | Hulfachor et al. .......... 438/224 |
| 2002/0060343 A1 * | 5/2002 | Gauthier et al. ............. 257/363 |

* cited by examiner

Primary Examiner—Long Pham
Assistant Examiner—Dana Farahani
(74) Attorney, Agent, or Firm—George O. Saile; Rosemary L.S. Pike

(57) ABSTRACT

A device and method are described for forming a grounded gate NMOS (GGNMOS) device used to provide protection against electrostatic discharge (ESD) in an integrated circuit (IC). The device is achieved by adding n-wells below the source and drain regions. By tailoring the dopant concentration profiles of the p-well and n-wells provided in the fabrication process, peak dopant concentrations are moved below the silicon surface. This moves ESD conduction deeper into the IC where thermal conductivity is improved, thereby avoiding thermal damage occurring with surface conduction. The device does not require a salicidation block or additional implantation and uses standard NMOS fabrication processing steps, making it advantageous over prior art solutions.

19 Claims, 4 Drawing Sheets

FULLY SILICIDED NMOS DEVICE FOR ELECTROSTATIC DISCHARGE PROTECTION

BACKGROUND OF THE INVENTION (1) Field of the Invention

The invention generally relates to the fabrication of semiconductor devices and, more particularly, to a method of forming an NMOS device for electrostatic discharge (ESD) protection in the fabrication of integrated circuits.

(2) Description of Prior Art

Integrated circuits (ICs) are susceptible to damage from a phenomenon called electrostatic discharge (ESD). ESD occurs during transportation and handling of the device when large static charges collect on their external pins. If not properly controlled, ESD will irreparably damage the IC as power dissipated during the discharge yields large temperature gradients within the device structure.

One solution to the problem of ESD is to connect a silicon controlled rectifier (SCR) on the IC near to the external pin bonding pad. When the voltage on the pad reaches a level beyond that of normal operation due to static charge, the SCR turns on, thereby providing a low resistance path for discharge. This protects the device by shunting this current away from the circuitry used in normal operation. Several approaches using SCRs exist. U.S. Pat. No. 5,369,041 to Duvvury teaches a method of building an SCR within a MOS process for the purpose of ESD protection. U.S. Pat. No. 5,728,612 to Wei et al. teaches a method of improving the performance of an SCR used for ESD protection. The resistance when the device is turn on is lowered by increasing the volume of contacts in the SCR by making the contact deeper in the IC. This improves the SCR performance without the need for increasing the size of the SCR. U.S. Pat. No. 5,843,813 to Wei et al. teaches another method of improving the performance of the ESD protection of an SCR that also reduces device switching noise. This device also uses deeper contacts to lower the resistance of the SCR when it is conducting.

A second method of ESD protection uses a grounded gate NMOS (GGNMOS) device to provide the low resistance discharge path. This is the protection method of the present invention. Refer now to FIG. 1 showing in cross section a typical GGNMOS device. It is to be understood that no portion of FIG. 1 is admitted to be prior art as to the present invention. Rather, this highly simplified diagram is provided in an effort to provide an improved understanding of the problems which are overcome by the present invention. A p-type well or substrate 10 is provided. A gate oxide 28 overlies the p-type well or substrate 10. A polysilicon gate electrode 30 overlies the gate oxide 28. N+ drain and source regions (14 and 22) are provided. A drain electrode 18 makes electrical connection to the drain 14, while a source electrode 26 makes electrical connection to the source 22. The source electrode 26 is connected to the gate electrode 30, both of which are connected to ground (as shown in FIG. 1) or to the most negative voltage potential used by the IC. For this description of the device operation, we will ground the source electrode 26 and gate electrode 30. While not shown, the p-type well or substrate 10 is also grounded. In order to provide a better electrical contact in active NMOS devices used on the IC, salicidation is performed on the upper surface of the n+ drain 14 and source 22 as shown in FIG. 1. Unfortunately, the salicidation reduces the ESD protection performance of a GGNMOS device due to discharge current localization. U.S. Pat. No. 6,100,125 to Hulfactor et al. teaches an ESD protection method using a GGNMOS device where drain contacts in the device are modified to reduce their conductivity. This is achieved by altering the lightly doped drain (LDD) region and by using a mask that prevents salicidation of the drain region.

Breakdown mechanisms provide the ESD protection in a GGNMOS device. Still referring to FIG. 1, those mechanisms will now be described. If the voltage on the drain electrode 18 is raised slightly above ground potential, the diode formed by p-type well 10 and drain region 14 will be reverse-biased and a depletion region will be formed between the two. A second depletion region exists between the source region 22 and the region of the p-type substrate or well 10 under the gate 30. This barrier holds the electrons in the source region 22. Any current that flows is due to leakage current in the reverse-biased drain/p-well junction.

If the drain electrode 18 voltage is increased, the depletion region between the p-type substrate or well 10 and drain region 14 will widen, moving it closer to the source region 22. When the voltage on the drain electrode 18 causes the drain depletion region to touch the source depletion region, the connection between the two depletion regions will have a low resistance. The result will be a very high current. This phenomenon is called "punch through" and the resulting current is called "punch through current". The characteristic curves with the punch through phenomenon for a typical NMOS FET are shown in FIG. 2. A second phenomenon known as drain diode breakdown is shown in FIG. 2. Prior to drain diode breakdown, the current of a real reverse-biased drain junction does not saturate. This is due to the generation of electron-hole pairs when the diode is reversed biased; a fact often neglected in the ideal diode equation. Soft breakdown is the phenomenon where conduction results from excessive generation of electron-hole pairs. If the electric field reaches a critical level where hard breakdown occurs, a small increase in drain voltage will cause a very large increase in current.

FIG. 3 shows a plot of $I_{DS}$ vs. $V_{DS}$ for different source to drain well spacings. As the spacing is decreased, the leakage $I_{DS}$ increases. This occurs because the two depletion regions described above are moved closer to each other, resulting in significant field penetration from the drain to the source. The potential barrier at the source is lowered, resulting in increased injection of electrons by the source, giving rise to increased $I_{DS}$. This is called drain induced barrier lowering (DIBL). Further increase of $V_{DS}$ will cause the depletion regions to touch resulting in punch through.

In some cases, a different phenomenon called "snapback" occurs prior to reaching punch voltage. The present invention uses snapback to provide ESD protection. This phenomenon will be discussed in the description of the present invention.

SUMMARY OF THE INVENTION

A principal object of the present invention is to provide a semiconductor device that provides electrostatic discharge (ESD) protection.

Another object of the present invention is to provide a semiconductor device that provides electrostatic discharge (ESD) protection without requiring additional processing steps.

Another object of the present invention is to provide a semiconductor device that provides electrostatic discharge (ESD) protection that does not require the salicidation blocking step.

Another object of the present invention is to provide a semiconductor device that provides electrostatic discharge (ESD) protection that does not require an additional implantation to improve ESD characteristics.

A still further object of the present invention is to provide a semiconductor device that provides electrostatic discharge (ESD) protection having a trigger point away from the semiconductor surface.

These objects are achieved using a process where n-wells are added below the source and drain regions in a GGNMOS device. The n-well and p-well doping profiles are tailored such that the peaks of the well concentrations occur away from the silicon surface. This reduces the depletion barrier between the p-well and n-well source. In addition, the increased electric field between the reverse biased n-well drain and p-well will result in higher electron-hole generation current. This injects more holes into the p-well producing a potential that will forward bias the p-well/n-well source junction. The result is effectively a bipolar NPN transistor that is conducting. Low resistance between the drain and source quickly removes any electrostatic charge. The conduction occurs away from the silicon surface where power may be effectively dissipated.

BRIEF DESCRIPTION OF THE DRAWINGS

In the accompanying drawings forming a material part of this description, there is shown.

DESCRIPTION OF THE PREFERRED EMBODIMENTS

The present invention uses a method of ESD protection using a grounded gate NMOS (GGNMOS) device to provide the low resistance discharge path. N-wells are added below the source and drain regions of a GGNMOS device in order to tailor the doping profiles of those regions. Snapback is used to provide ESD protection. As $V_{DS}$ increases, the potential barrier at the n-well source is lowered due to the DIBL effect. Generation of electron-hole pairs in the drain well depletion region also occurs. This generation current dominates and increases with $V_{DS}$. This results in a higher electric field and higher electron-hole generation current. The hole current will be injected into the p-well, forward biasing the p-well/n-well source junction. The DIBL effect aids this by lowering the potential barrier at the n-well source. Once the p-well/n-well source junction is forward biased, the device behaves as an NPN transistor where the drain acts as the collector. A low resistance discharge path is created. Using prior art advanced NMOS processes with LDD junctions, this conduction triggers near the surface of the device where thermal conductivity is poor. This surface heating may result in damage to the device.

Figure 1:
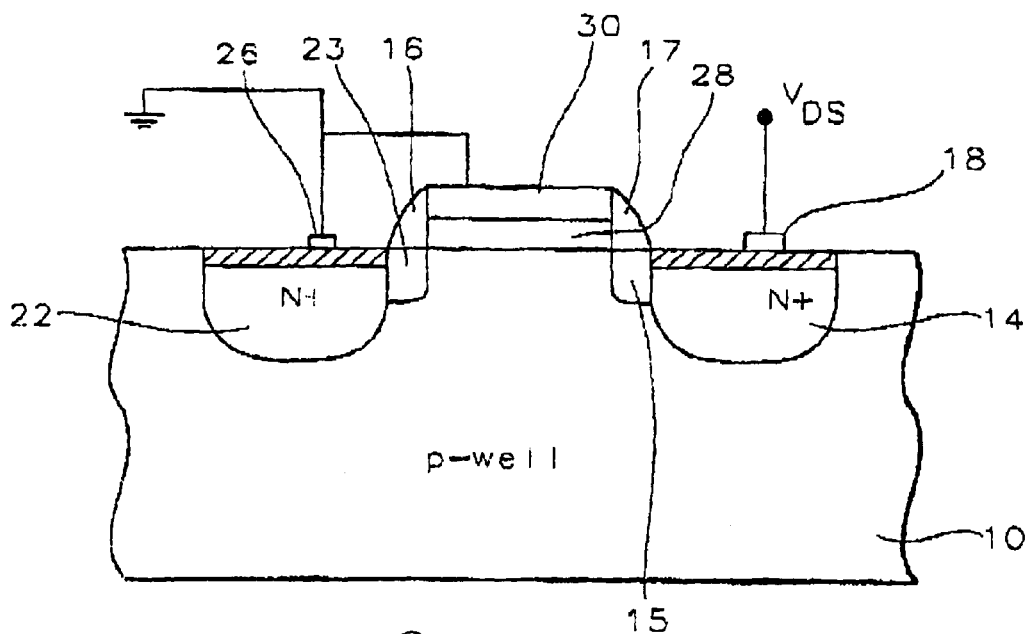
FIG. 1 showing a cross section of a typical grounded gate NMOS (GGNMOS) device.
Figure 2:
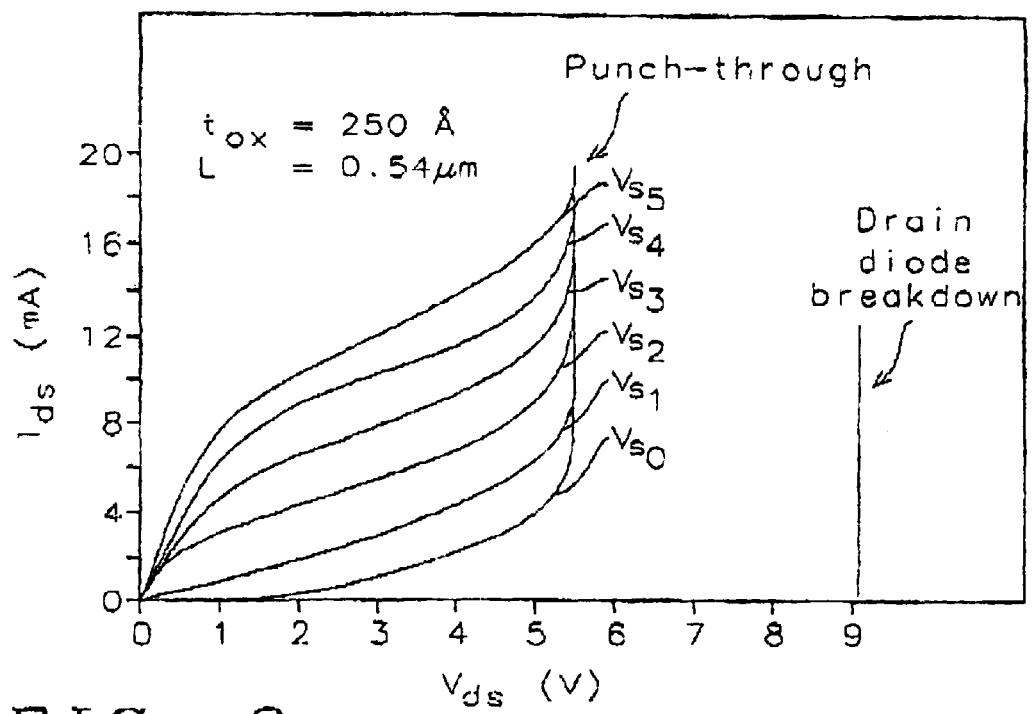
FIG. 2 showing a graph of typical $I_{DS}$ vs. $V_{DS}$ characteristics of a GGNMOS device.
Figure 3:
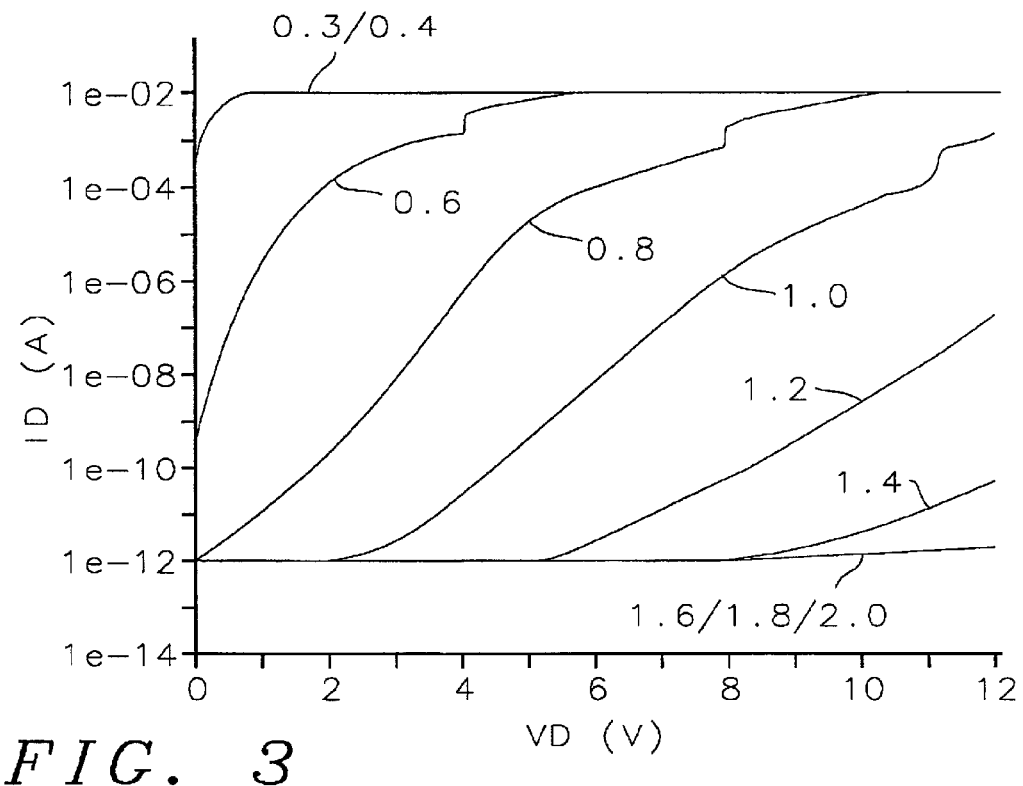
FIG. 3 showing a graph of $I_{DS}$ vs. $V_{DS}$ for different source to drain well spacings.
Figure 4:
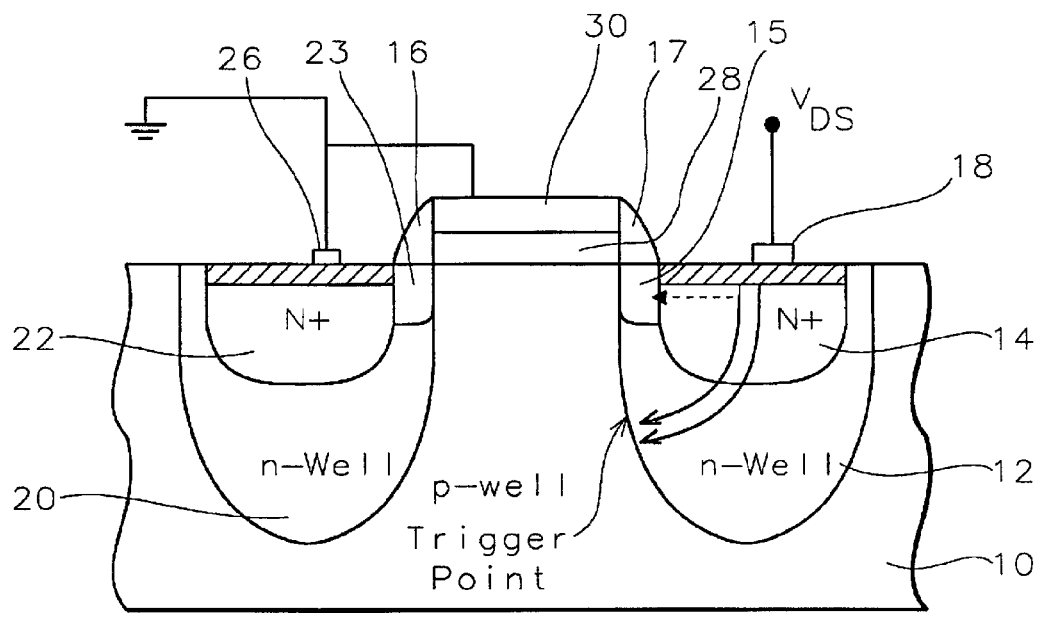
FIG. 4 showing a cross section of the grounded gate NMOS (GGNMOS) device of the present invention.

Refer now to FIG. 4 showing in cross section the GGNMOS device of the present invention. A p-type substrate or well 10 is provided. N-wells 12 and 20 are formed in the p-type substrate or well 10. A gate oxide 28 is patterned overlying the p-type substrate or well 10 and n-wells 12 and 20. A polysilicon gate electrode 30 is formed overlying the gate oxide 28 between the n-wells 12 and 20. Lightly doped drain (LDD) regions are formed (15 and 23) are formed by light implantation using the polysilicon gate electrode 30 as a mask. Oxide spacers 16 and 17 are formed on the side of the polysilicon gate electrode 30. These oxide spacers 16 and 17 along with the polysilicon gate electrode 30 form the mask for implantation of the n+ source and drain regions 14 and 22, respectively. Drain electrode 18 makes electrical connection to the drain 14, while source electrode 26 makes electrical connection to the source 22. The source electrode 26 is connected to the gate electrode 30, both of which are connected to ground (as shown in FIG. 4) or to the most negative voltage potential used by the IC. For this description of the device operation, we will ground the source electrode 26 and gate electrode 30. While not shown, the p-type substrate or well 10 is also grounded. In order to provide a better electrical contact in active NMOS devices used on the IC, salicidation is performed on the upper surface of the n+ drain 14 and source 22 as shown in FIG. 4.

The n-wells 12 and 20 and p-type substrate or well 10 are tailored to bring their peak concentrations to a point between about 0.5 and 1.5 μm from the semiconductor surface. This peak corresponds to the minimum drain depletion width and the point where conduction will trigger, By avoiding triggering at the semiconductor surface, the thermal conductivity is improved at this deeper peak concentration point. The n-wells 12 and 20 are formed using phosphorous ion implantation with a dose of between about $9 \times 10^{12}$ and $5 \times 10^{13}$ ions/cm$^2$ ($2 \times 10^{13}$ ions/cm$^2$ nominal) and an implantation energy of between about 400 and 650 keV (500 keV nominal). This implantation is performed prior to the p-well implantation and after shallow trench isolation processing. The p-type substrate or well 10 is formed using two boron ion implantations. One has a dose of between about $7 \times 10^{12}$ and $4 \times 10^{13}$ ions/cm$^2$ ($1 \times 10^{13}$ ions/cm$^2$ nominal) and an implantation energy of between about 250 and 400 keV (300 keV nominal). The second p-well implantation has a dose of between about $1 \times 10^{12}$ and $1 \times 10^{13}$ ions/cm$^2$ ($4.5 \times 10^{12}$ ions/cm$^2$ nominal) and an implantation energy of between about 100 and 250 keV (150 keV nominal). These two implantations are performed after the n-well implantation and before the gate oxide process.

Figure 5:
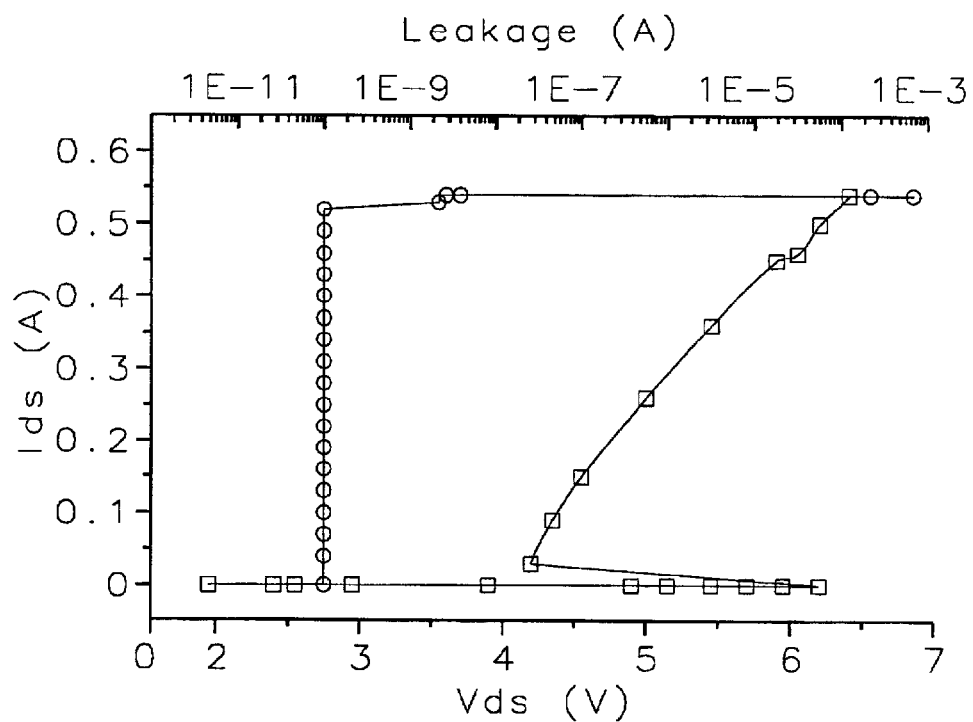
FIG. 5 showing test results for the present invention including the snapback phenomenon.

FIG. 5 shows test results for the present invention including the snapback phenomenon. As $V_{DS}$ increases, there is only leakage current up to approximately 6.2 volts. Once this threshold is reached, the snapback phenomenon occurs and immediately lowers $V_{DS}$ to about 4.3 volts. The negative resistance region observed is due to the availability of more charge carriers for multiplication. The doping profile is tailored so that snapback occurs prior to punch through.

Figure 6:
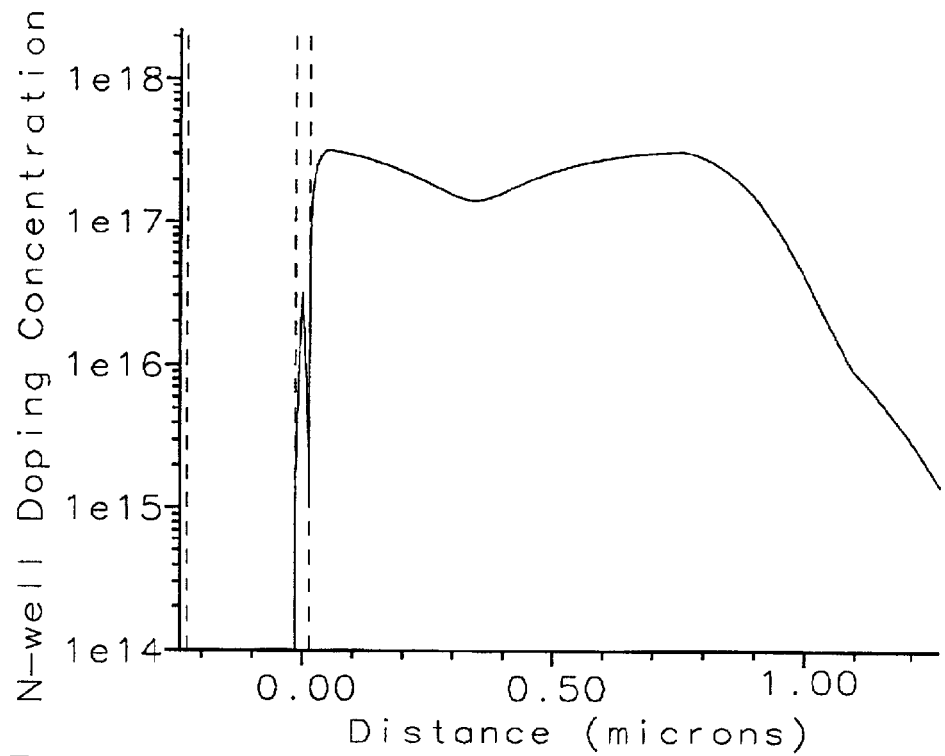
FIG. 6 showing the n-well doping profile for the present invention.
Figure 7:
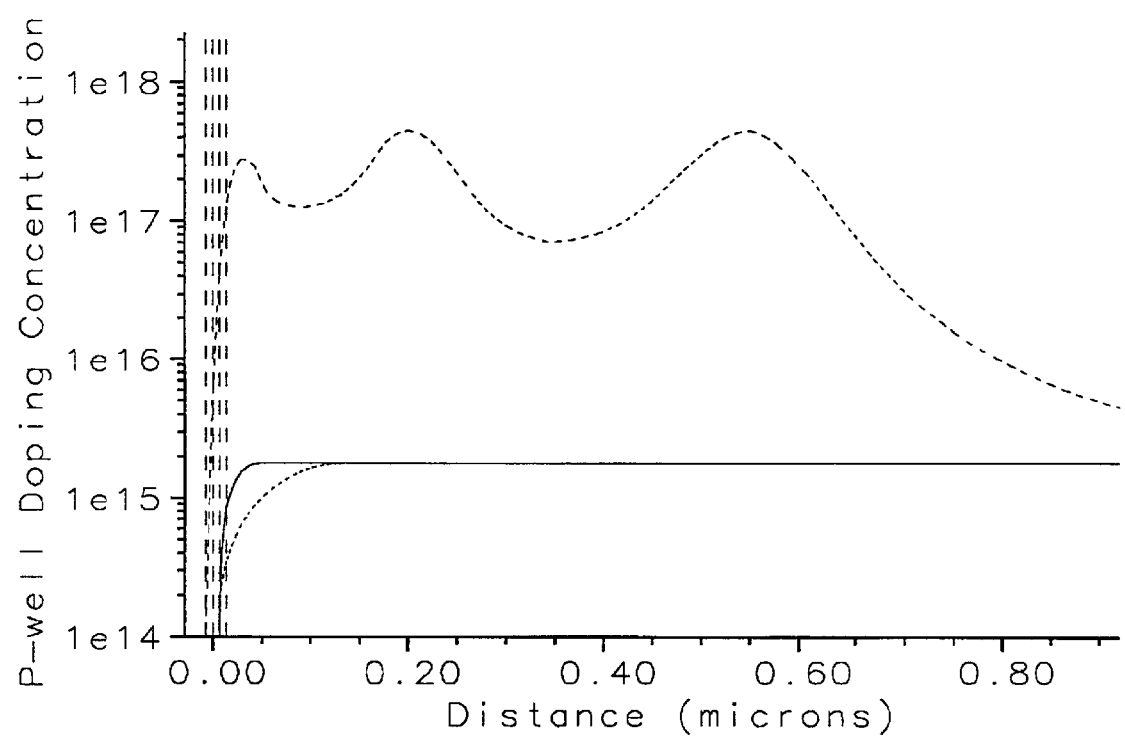
FIG. 7 showing the p-well doping profile for the present invention.

FIG. 6 shows the n-well doping profile for the present invention. A peak concentration of between about $1 \times 10^{17}$ and $5 \times 10^{18}$ atoms/cm$^3$ ($7 \times 10^{17}$ nominal) occurs between about 0.5 and 1.5 μm (0.75 μm nominal) from the IC surface. The n-well doping profile is formed by implanting phosphorous ions with a dose of $2 \times 10^{13}$ ions/cm$^2$ and an energy of 500 keV plus some threshold (Vt) and punch-through implantations. FIG. 7 shows the p-well doping profile for the present invention. A peak of between about $1 \times 10^{17}$ and $5 \times 10^{18}$ atoms/cm$^3$ ($7 \times 10^{17}$ nominal) occurs between about 0.5 and 1.5 $\mu$m (0.6 $\mu$m nominal) from the IC surface. The p-well doping profile is formed by implanting boron ions with a dose of $1\times10^{13}$ ions/cm$^2$ and an energy of 300 keV, implanting boron ions with a dose of $4.5\times10^{12}$ ions/cm$^2$ and an energy of 150 keV, plus some threshold (Vt) and punch-through implantations.

Several key differences should be noted between the present invention and U.S. Pat. No. 5,728,612 to Wei et al. Wei et al. use the n-well in an SCR device to enlarge the conduction volume. This reduces hot spots and improves ESD performance. The present invention applies to a GGN-MOS device and uses tailored n-well and p-well doping profiles to move the conduction away from the surface and adjust the ESD trigger voltage. In these important respects, the two devices and their method of operation are different.

In summary, the present invention uses a process where n-wells are added below the source and drain regions in a GGNMOS device. The n-well and p-well doping profiles are tailored such that the peaks of the well concentrations occur away from the silicon surface. This reduces the depletion barrier between the p-well and n-well source. In addition, as drain voltage increases, an increased electric field forms between the reverse biased n-well drain and p-well resulting in higher electron-hole generation current. This injects more holes into the p-well, producing a potential that will forward bias the p-well/n-well source junction. The result is a conducting bipolar NPN transistor with low resistance between the drain (collector) and source (emitter). The conduction occurs away from the silicon surface where power developed by removing the electrostatic charge may be effectively dissipated.

While the invention has been particularly shown and described with reference to the preferred embodiments thereof, it will be understood by those skilled in the art that various changes in form and details may be made without departing from the spirit and scope of the invention.

What is claimed is:

1. A method of forming a device for dissipating electrostatic discharge in an integrated circuit comprising:
   providing a semiconductor substrate;
   providing a p-region in said semiconductor substrate;
   forming a source n-well and drain n-well in said p-region wherein said p-region, said source n-well, and said drain n-well have a peak in concentration at a depth of between 0.5 and 1.5 $\mu$m;
   providing a gate oxide overlying said p-region in the space between said source n-well and said drain n-well;
   forming an n+ source region and an n+ drain region within a top portion of said source n-well and said drain n-well, respectively;
   forming a lightly doped source region and a lightly doped drain region within said source n-well and said drain n-well, respectively and adjacent to said source n-well and said drain n-well, respectively;
   forming a gate electrode overlying said gate oxide and not overlapping said source n-well and said drain n-well;
   forming conductive contacts to said n+ source region and said n+ drain region; and
   electrically connecting said gate electrode and said conductive contact to said n+ source thereby completing fabrication of said device for dissipating electrostatic discharge.

2. The method according to claim 1 wherein said peak concentration in said p-region is between about $1\times10^{17}$ and $5\times10^{18}$ atoms/cm$^3$.

3. The method according to claim 2 wherein said peak concentration in said p-region is formed by dual implantation of boron ions, one with a dose of between about $7\times10^{12}$ and $4\times10^{13}$ ions/cm$^2$ ($1\times10^{13}$ ions/cm$^2$ nominal) and an energy of between about 250 and 400 keV (300 keV nominal) and another with a dose of between about $1\times10^{12}$ and $1\times10^{13}$ ions/cm$^2$ ($4.5\times10^{12}$ ions/cm$^2$ nominal) and an energy of between about 100 and 250 (150 keV nominal) and threshold and punch-through implantations.

4. The method according to claim 1 wherein said peak concentration in said source n-well and said drain n-well is between about $1\times10^{17}$ and $5\times10^{18}$ atoms/cm$^3$.

5. The method according to claim 4 wherein said peak concentration in said source n-well and said drain n-well is formed by implantation of phosphorous ions with a dose of between about $9\times10^{12}$ and $5\times10^{13}$ ions/cm$^2$ ($2\times10^{13}$ ions/cm$^2$ nominal) and an energy of between about 400 and 650 keV (500 keV nominal) and threshold and punch-through implantations.

6. A method of forming a device for dissipating electrostatic discharge in an integrated circuit comprising:
   providing a semiconductor substrate;
   providing a p-region in said semiconductor substrate;
   forming a source n-well and drain n-well in said p-region;
   providing a gate oxide overlying said p-region in the space between said source n-well and said drain n-well;
   forming an n+ source region and an n+ drain region within said source n-well and said drain n-well, respectively and siliciding said n+ source region and said n+ drain region;
   forming a lightly doped source region and a lightly doped drain region within said source n-well and said drain n-well, respectively and adjacent to said source n-well and said drain n-well, respectively;
   forming a gate electrode overlying said gate oxide and not overlapping said source n-well and said drain n-well;
   forming conductive contacts to said n+ source region and said n+ drain region; and
   electrically connecting said gate electrode and said conductive contact to said n+ source thereby completing fabrication of said device for dissipating electrostatic discharge.

7. The method according to claim 6 wherein said p-region has a peak in concentration at a depth of between about 0.5 and 1.5 $\mu$m.

8. The method according to claim 7 wherein said peak concentration in said p-region is between about $1\times10^{17}$ and $5\times10^{18}$ atoms/cm$^3$.

9. The method according to claim 8 wherein said peak concentration in said p-region is formed by dual implantation of boron ions, one with a dose of between about $7\times10^{12}$ and $4\times10^{13}$ ions/cm$^2$ ($1\times10^{13}$ ions/cm$^2$ nominal) and an energy of between about 250 and 400 keV (300 keV nominal) and another with a dose of between about $1\times10^{12}$ and $1\times10^{13}$ ions/cm$^2$ ($4.5\times10^{12}$ ions/cm$^2$ nominal) and an energy of between about 100 and 250 keV (150 keV nominal) and threshold and punch-through implantations.

10. The method according to claim 6 wherein said source n-well and said drain n-well have a peak in concentration at a depth of between about 0.5 and 1.5 $\mu$m.

11. The method according to claim 10 wherein said peak concentration in said source n-well and said drain n-well is between about $1\times10^{17}$ and $5\times10^{18}$ atoms/cm$^3$.

12. The method according to claim 11 wherein said peak concentration in said source n-well and said drain n-well is formed by implantation of phosphorous ions with a dose of between about $9\times10^{12}$ and $5\times10^{13}$ ions/cm$^2$ ($2\times10^{13}$ ions/cm$^2$ nominal) and an energy of between about 400 and 650 keV (500 keV nominal) and threshold and punch-through implantations.

13. A method of forming a device for dissipating electrostatic discharge in an integrated circuit comprising:

providing a semiconductor substrate;

providing a p-region in said semiconductor substrate;

forming a source n-well and drain n-well in said p-region;

providing a gate oxide overlying said p-region in the space between said source n-well and said drain n-well and not overlapping said source n-well and said drain n-well;

forming an n+ source region and an n+ drain region within said source n-well and said drain n-well, respectively;

forming a lightly doped source region and a lightly doped drain region within said source n-well and said drain n-well, respectively and adjacent to said source n-well and said drain n-well, respectively;

forming a gate electrode overlying said gate oxide;

forming conductive contacts to said n+ source region and said n+ drain region; and electrically connecting said gate electrode and said conductive contact to said n+ source thereby completing fabrication of said device for dissipating electrostatic discharge.

14. The method according to claim 13 wherein said p-region has a peak in concentration at a depth of between about 0.5 and 1.5 μm.

15. The method according to claim 14 wherein said peak concentration in said p-region is between about $1\times10^{17}$ and $5\times10^{18}$ atoms/cm$^3$.

16. The method according to claim 15 wherein said peak concentration in said p-region is formed by dual implantation of boron ions, one with a dose of between about $7\times10^{12}$ and $4\times10^{13}$ ions/cm$^2$ ($1\times10^{13}$ ions/cm$^2$ nominal) and an energy of between about 250 and 400 keV (300 keV nominal) and another with a dose of between about $1\times10^{12}$ and $1\times10^{13}$ ions/cm$^2$ ($4.5\times10^{12}$ ions/cm$^2$ nominal) and an energy of between about 100 and 250 keV (150 keV nominal) and threshold and punch-through implantations.

17. The method according to claim 13 wherein said source n-well and said drain n-well have a peak in concentration at a depth of between about 0.5 and 1.5 μm.

18. The method according to claim 17 wherein said peak concentration in said source n-well and said drain n-well is between about $1\times10^{17}$ and $5\times10^{18}$ atoms/cm$^3$.

19. The method according to claim 18 wherein said peak concentration in said source n-well and said drain n-well is formed by implantation of phosphorous ions with a dose of between about $9\times10^{12}$ and $5\times10^{13}$ ions/cm$^2$ ($2\times10^{13}$ ions/cm$^2$ nominal) and an energy of between about 400 and 650 keV (500 keV nominal) and threshold and punch-through implantations.

* * * * *